US008921159B2

(12) United States Patent
Pruitt

(10) Patent No.: US 8,921,159 B2
(45) Date of Patent: Dec. 30, 2014

(54) STACKED INTERPOSER LEADFRAMES

(71) Applicant: Linear Technology Corporation, Milpitas, CA (US)

(72) Inventor: David Alan Pruitt, San Jose, CA (US)

(73) Assignee: Linear Technology Corporation, Milpitas, CA (US)

(*) Notice: Subject to any disclaimer, the term of this patent is extended or adjusted under 35 U.S.C. 154(b) by 57 days.

(21) Appl. No.: 13/924,258

(22) Filed: Jun. 21, 2013

(65) Prior Publication Data

US 2013/0277811 A1    Oct. 24, 2013

Related U.S. Application Data

(63) Continuation of application No. 12/795,330, filed on Jun. 7, 2010, now Pat. No. 8,492,884.

(51) Int. Cl.
| H01L 23/02 | (2006.01) |
| H01L 23/495 | (2006.01) |
| H01L 23/492 | (2006.01) |
| H01L 21/50 | (2006.01) |

(52) U.S. Cl.
CPC ............ *H01L 23/495* (2013.01); *H01L 23/492* (2013.01); *H01L 23/49537* (2013.01); *H01L 23/49562* (2013.01); *H01L 21/50* (2013.01); H01L 2224/32245 (2013.01); H01L 2924/10253 (2013.01); H01L 2224/33181 (2013.01)
USPC ........... 438/109; 438/107; 438/123; 257/685; 257/723; 257/E23.085; 257/E25.013

(58) Field of Classification Search
USPC .......... 438/107, 109, 123, 111; 257/E21.506, 257/E21.532, E23.141, E23.031, 666, 676, 257/685, 723, 670
See application file for complete search history.

(56) References Cited

U.S. PATENT DOCUMENTS

| 4,680,613 A | 7/1987 | Daniels et al. |
| 4,918,511 A | 4/1990 | Brown |
| 5,150,194 A | 9/1992 | Brooks et al. |

(Continued)

FOREIGN PATENT DOCUMENTS

TW    200812023 A    3/2008

OTHER PUBLICATIONS

International Search Report and Written Opinion of the International Searching Authority issued in International Application No. PCT/US2011/032401 dated Jul. 11, 2011.

(Continued)

*Primary Examiner* — S. V. Clark
*Assistant Examiner* — Krista Soderholm
(74) *Attorney, Agent, or Firm* — McDermott Will & Emery LLP

(57) ABSTRACT

A method of manufacturing integrated circuit (IC) devices includes the steps of providing a first frame that has openings each having a perimeter with shaped notches, placing a first die in at least one of the openings, and placing a second frame over the first frame. The second frame has a first partial dam bar with a first shaped tip that fits into a first shaped notch of the first frame. The method also includes the step of placing a third frame over the second frame. The third frame has a second partial dam bars with a second shaped tip that fits into a second shaped notch of the first frame. Each perimeter and the respective first and second partial dam bars cooperate to form a continuous dam completely encircling the die within the respective opening.

16 Claims, 7 Drawing Sheets

(56) References Cited

U.S. PATENT DOCUMENTS

| | | | |
|---|---|---|---|
| 5,484,959 | A | 1/1996 | Burns |
| 5,559,369 | A | 9/1996 | Newman |
| 5,874,781 | A | 2/1999 | Fogal et al. |
| 5,949,651 | A | 9/1999 | Barrow |
| 5,978,224 | A | 11/1999 | Barrow |
| 5,996,805 | A | 12/1999 | Evers |
| 6,008,073 | A | 12/1999 | King et al. |
| 6,087,204 | A | 7/2000 | Fogelson |
| 6,225,683 | B1 | 5/2001 | Yalamanchili et al. |
| 6,630,732 | B2 | 10/2003 | Corisis |
| 6,661,083 | B2 | 12/2003 | Lee et al. |
| 6,703,692 | B1 | 3/2004 | Pruitt |
| 6,747,344 | B2 | 6/2004 | Corisis et al. |
| 6,781,219 | B2 | 8/2004 | Bissey |
| 6,884,657 | B1 | 4/2005 | Fogal et al. |
| 6,995,459 | B2 | 2/2006 | Lee et al. |
| 7,005,730 | B2 | 2/2006 | Verma et al. |
| 7,057,281 | B2 | 6/2006 | Peng et al. |
| 7,250,685 | B2 | 7/2007 | Shim et al. |
| 7,288,833 | B2 | 10/2007 | Huat et al. |
| 2007/0001278 | A1 | 1/2007 | Jeon et al. |
| 2007/0108575 | A1 | 5/2007 | Montgomery |
| 2007/0132091 | A1 | 6/2007 | Wu et al. |
| 2007/0181982 | A1 | 8/2007 | Bathan et al. |
| 2007/0278639 | A1 | 12/2007 | Bauer et al. |
| 2007/0296086 | A1 | 12/2007 | Ju et al. |
| 2008/0012100 | A1 | 1/2008 | Punzalan et al. |
| 2008/0230881 | A1 | 9/2008 | Camacho et al. |
| 2009/0212405 | A1 | 8/2009 | Liu et al. |
| 2009/0294935 | A1 | 12/2009 | Tay et al. |
| 2010/0019359 | A1 | 1/2010 | Pagaila et al. |

OTHER PUBLICATIONS

Search Report Taiwan Patent Application No. 100113702 dated Dec. 26, 2013.

STACKED INTERPOSER LEADFRAMES

CROSS-REFERENCES TO RELATED APPLICATIONS

This application is a continuation of application Ser. No. 12/795,330 filed on Jun. 7, 2010 and currently pending, which is incorporated herein by reference in its entirety.

BACKGROUND

1. Field

The present disclosure generally relates to integrated circuit (IC) packages and, more particularly, to leadframes and method of manufacturing leadframes for use in IC packages.

2. Description of the Related Art

The silicon chips on which integrated circuits are formed are so small that they are sensitive to damage and hard to handle, and many IC chips are packaged in enclosures that protect the chips and provide larger contact leads that can be attached to circuitry on substrates such as printed circuit boards. One common method of assembling an IC package of this type is to attach a "leadframe", or "lead frame", as a mechanical support to the die during its assembly. A portion of the leadframe is trimmed off, leaving only the leads that provide the external connections for the finished product. A leadframe comprises a "die paddle", to which the die is attached, and "leads", which provide external electrical connections. One method of connecting the die to the leads is by wirebonding small jumper wires from the die contacts to various leads. In other cases, a finger of the leadframe may overlay the die directly and be soldered directly to the die contact. Lead frames are constructed from flat sheet metal either by stamping or etching. "Downsetting" consists of pushing the die paddle down relative to the bonding fingers in compliance with standard industry requirements. FIG. 1 illustrates an example of a leadframe with a die paddle that has been downset. FIG. 2 illustrates an IC package that has been cut away to show the IC die and the leads that remain after the leadframe is trimmed and formed.

It is also possible to assemble a number of IC chips onto a small substrate and package this assembly to form an IC device. As the number of IC chips and single devices being integrated into a single device increase, the package size grows and the amount of heat being generated by the IC devices increases. One approach to keeping the size of the integrated package down has been to stack IC chips, which presents challenges in providing interconnects and heat dissipation.

SUMMARY

There is a need for a system that provides improved heat dissipation for stacked IC devices to enable the integration of larger numbers of devices while maintaining a minimal package size.

In certain embodiments, a stacked leadframe assembly is disclosed. The stacked leadframe assembly includes a first die having a surface that defines a mounting plane, a first leadframe stacked over and attached to the first die, a second die stacked over and attached to the first leadframe, and a second leadframe stacked over and attached to the second die. The first and second leadframes have die paddles with extended side panels that have attachment surfaces lying in the mounting plane.

In certain embodiments, an integrated circuit device is disclosed. The integrated circuit device includes a substrate having circuitry and at least one stacked leadframe assembly attached to the substrate. The stacked leadframe assembly comprises a first die, a first leadframe stacked over the first die, at least one second die stacked over the first leadframe; and at least one second leadframe stacked over the second die.

In certain embodiments, a method of manufacturing stacked leadframe assemblies is disclosed. The method includes the steps of placing a first die on a carrier, placing a first leadframe over the first die and attaching the first leadframe to the first die, placing a second die over the first leadframe and attaching the second die to the first leadframe, and placing a second leadframe over the second die and attaching the second leadframe to the second die.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

DETAILED DESCRIPTION

The system and method disclosed herein describe how multiple stacking leadframes are integrated with multiple IC die to form a stacked leadframe assembly that can be handled as an assembly in the process of packaging IC assemblies or can be integrated onto a substrate as part of an integrated assembly forming a more complicated single device.

In the following detailed description, numerous specific details are set forth to provide a full understanding of the present disclosure. It will be apparent, however, to one ordinarily skilled in the art that embodiments of the present disclosure may be practiced without some of the specific details. In other instances, well-known structures and techniques have not been shown in detail so as not to obscure the disclosure.

Figure 1:
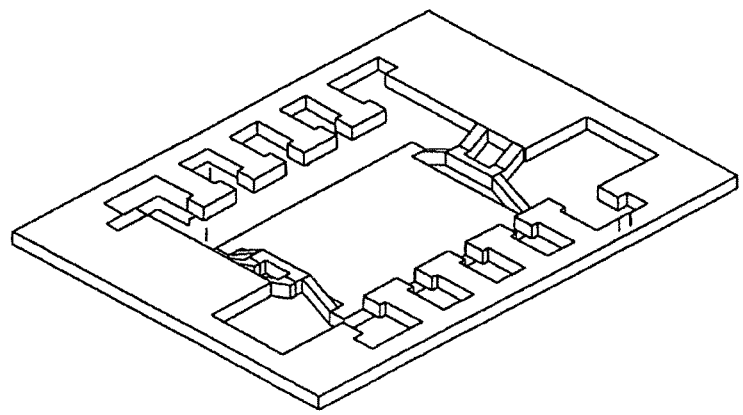
FIG. 1 is a perspective view of a leadframe having a downset die paddle.
Figure 2:
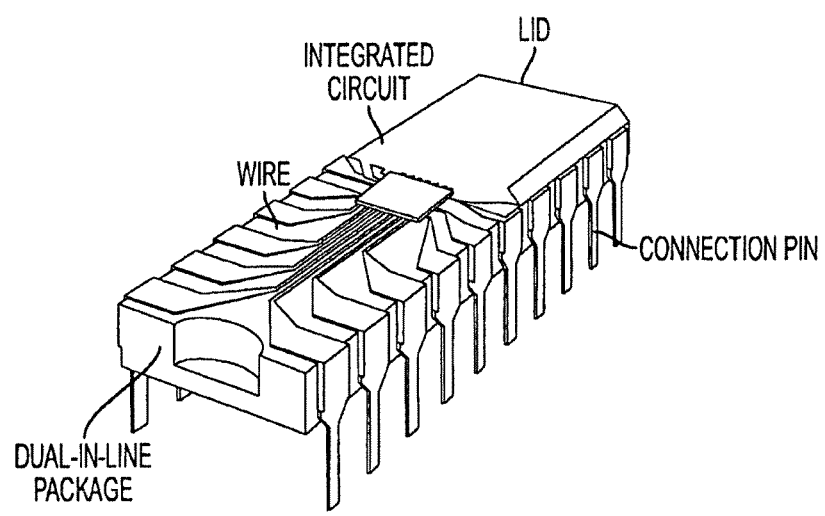
FIG. 2 is cut-away illustration of an IC package showing the die and the portion of the leadframe that remains after trimming and forming.
Figure 3A:
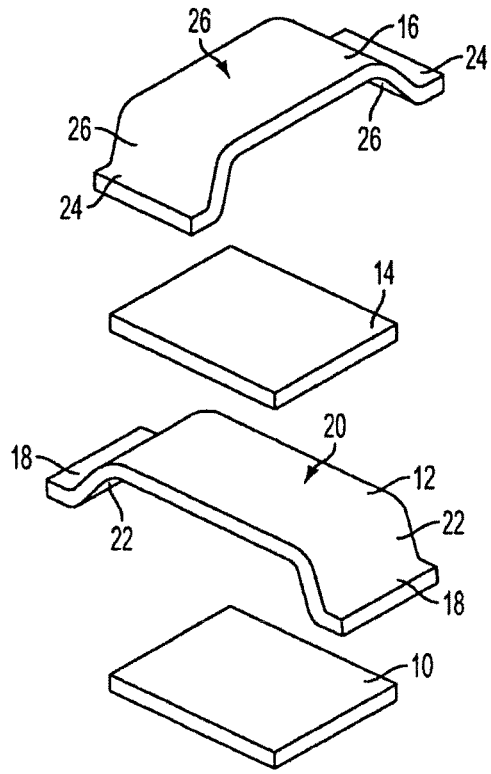
FIG. 3A is an exploded view of an embodiment of a leadframe stack assembly according to certain aspects of the present disclosure.

FIG. 3A is an exploded view of an embodiment of a leadframe stack assembly according to certain aspects of the present disclosure. Working upwards from the bottom of the stack, an IC die 10 is overlaid with a leadframe 12. Leadframe 12 has a central section 20, called a "die paddle", that matches the die 10 in size and shape and, in this embodiment, is shown as a monolithic element with extended side panels that extend out and down from the die paddle 20. The furthermost end of the side panels form support members 18 that have flat attachment surfaces on their undersides. In this embodiment, heat conduction is an important attribute and so the portions of the leadframe that form connecting members 22 are wide and continuous to provide improved heat conduction from the die paddle 20 to the support members 18. In certain embodiments, the connecting members 22 might be a single narrow element or multiple elements.

The next element in the stack is a second IC die 14. This may be the same type of die as die 12, or may be a different die. While it is advantageous for die 14 to be the same size or smaller than die 12, it is possible to use a die 14 that is larger than die 12. The die paddle 20 of leadframe 12 must be sized to accommodate both die 12 and die 14 as they both attach to die paddle 12.

Leadframe 16 is located over die 14 with a die paddle area 26 and extended side panels similar to those of leadframe 12, having support members 24 and connecting members 26. In this embodiment, the side panels extend in directions perpendicular to the side panels of leadframe 12. The height of the die paddle 26 above the undersides of the support members 24 is determined by the total thickness of the dice 10 and 14 and leadframe 12 plus any thickness of adhesive, solder, thermal compound, or other material placed between the dice and the leadframes. Additional pairs of die and leadframes (not shown) can be added to this stack, as described further in FIG. 4.

Figure 3B:
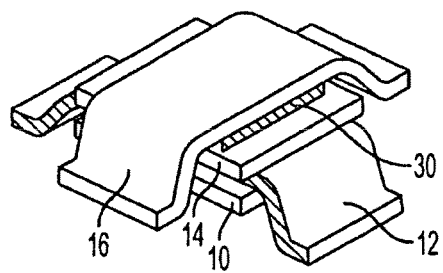
FIG. 3B is a perspective view of an assembled stacked leadframe assembly according to certain aspects of the present disclosure.

FIG. 3B is a perspective view of an assembled stacked leadframe assembly according to certain aspects of the present disclosure. The dice 10 and 14 and leadframes 12 and 16 from FIG. 3A are shown here after assembly. Solder 30 is shown as extending beyond the edge of leadframe 16 after reflow, attaching leadframe 16 to die 14. Other solder layers between die 10 and leadframe 12 and between leadframe 12 and die 14 are not visible in this drawing. In certain embodiments, a thermally conductive adhesive could be used in place of the solder. An adhesive could also be electrically conductive or insulating depending on the design of the stack. The dimensions of leadframes 12 and 16 are, in this embodiment, such that the undersides of the support members are in the same plane as the underside of die 10. This coplanarity allows this assembly to be attached to a substrate using solder or adhesive. In certain embodiments, the assembled stacked leadframe assembly will have good physical integrity and can be packaged on tape reels and placed using automatic equipment in a manner very similar to the packaging and placement of IC packages.

Figure 4:
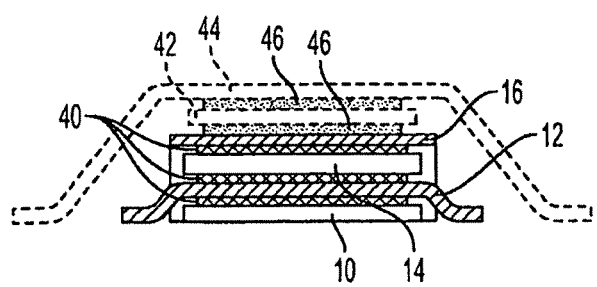
FIG. 4 is a cross-section of an embodiment of a leadframe stack assembly according to certain aspects of the present disclosure.

FIG. 4 is a cross-section of an embodiment of a leadframe stack assembly according to certain aspects of the present disclosure. The dice 10 and 14 and the leadframes 12 and 16 from FIG. 3A are shown here in the assembled state. The extended side panels of leadframe 16, in this view, are perpendicular to the page and so the front side panel is not visible. The die paddle of leadframe 16 is shown as the section 16 while the rear side panel is shown as the solid element below section 16 and behind dice 10 and 14. In the embodiment shown in FIG. 4, an adhesive 40 is shown between the die and leadframes. Adhesive 40 may be a thermally conductive adhesive, thermal compound, solder, electrically conductive adhesive, or other material providing the desired electrical, thermal, and structural characteristics. While the adhesive 40 is shown as having a thickness commensurate with the thickness of the adjacent die 10 or 14, the thickness of this adhesive may vary from essentially zero, in the example of a thermal compound intended to fill irregularities in the surface of the dice and leadframes, to a layer that may be thicker than the die, in the example of a material selected to provide thermal and electrical insulation. In addition, while the adhesive is shown in this embodiment as a single material in the three layers of adhesive 40, each layer may be a different material without departing from the scope of the claims.

FIG. 4 also discloses a third die 42 and third leadframe 44 in phantom, located above the dice 10 and 14 and leadframes 12 and 16. Layers of material 46 are shown between the die 42 and leadframes 16 and 44. Other embodiments (not shown) include additional layers of die and leadframes added above leadframe 44, with the extended side panels of the additional leadframes becoming longer with each layer to, as shown in this embodiment, reach the substrate.

Figure 5:
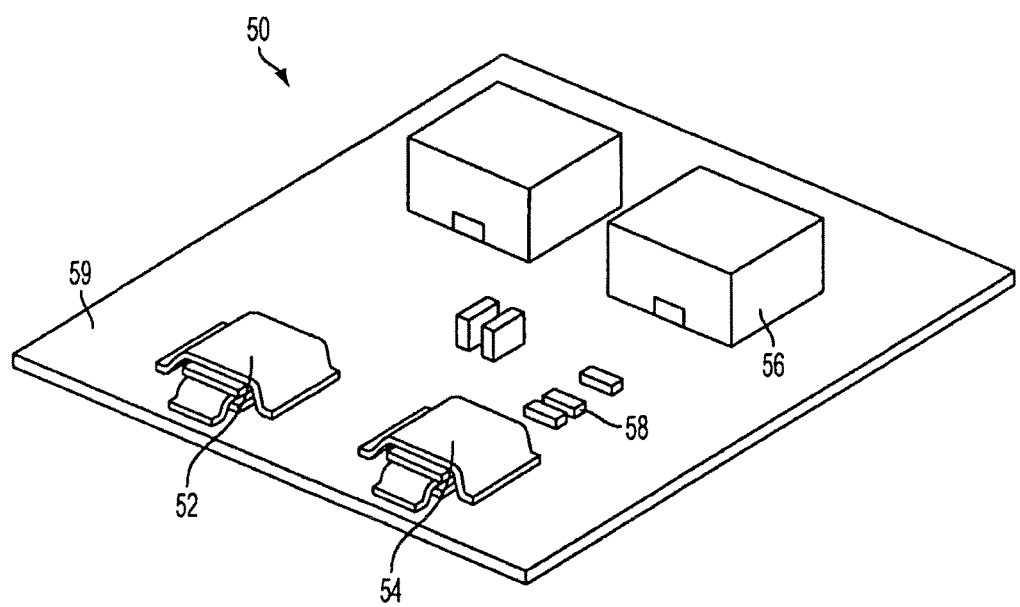
FIG. 5 is a perspective view of an integrated circuit assembly incorporating stacked leadframe assemblies according to certain aspects of the present disclosure.

FIG. 5 is a perspective view of an integrated circuit assembly 50 incorporating stacked leadframe assemblies 52 and 54 according to certain aspects of the present disclosure. The substrate 59 may be made of a nonconductive material such as, for example, bismaleimide triazine (BT) or a metal. The stacked leadframe assemblies 52 and 54 may be soldered to plated areas (not shown) on a BT substrate or bonded with an adhesive. The choice of adhesive will depend in part upon the function to be provided by the leadframes. If the leadframes are to conduct heat away from the IC devices, then it is advantageous for the adhesive to be thermally conductive. The leadframes can also provide electrical connection of the IC die to the substrate, including both individual circuits as well as power and ground connections, in which case it is advantageous to use an electrically conductive adhesive. The IC assembly may also include other large and small devices 56 and 58 that together provide the functionality of assembly 50. Other types of attachment methods are possible, including mechanical fasteners, clamps, clips, and spring-loaded mechanisms that hold the stacked leadframe assemblies in contact with the substrate.

Figure 6:
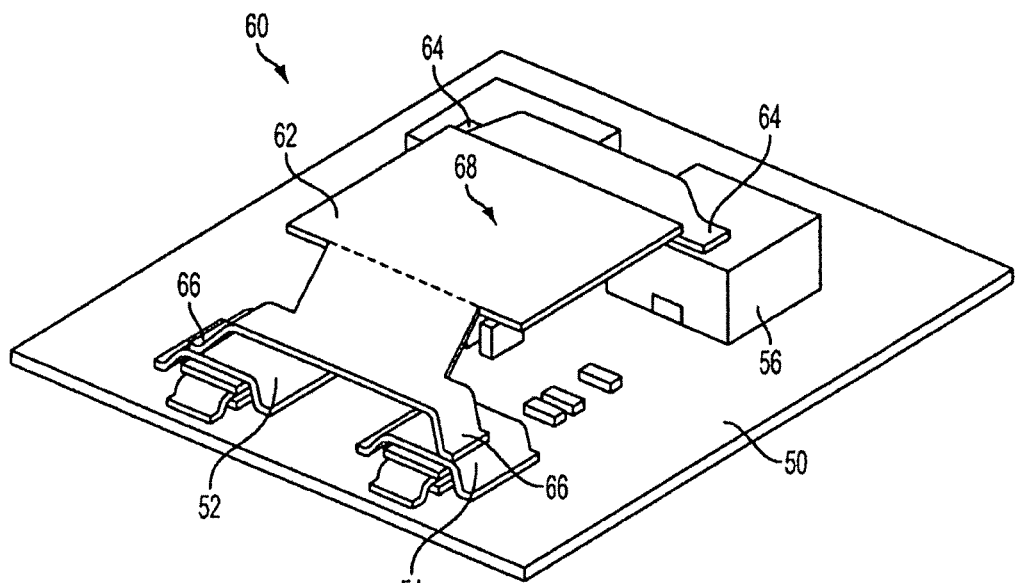
FIG. 6 is a perspective view of the integrated circuit assembly of FIG. 5 with the addition of a heat sink according to certain aspects of the present disclosure.

FIG. 6 is a perspective view of the integrated circuit assembly 50 of FIG. 5 with the addition of a heat sink 62 according to certain aspects of the present disclosure. In this embodiment of assembly 60, heat sink 62 includes attachment pads 66 at a height and location to be in contact with the top leadframe of stacked leadframe assemblies 52 and 54 as well as attachment pads 64 at a height and location to be in contact with the tops of components 56. The attachment pads 66 and 64 are, in this embodiment, bonded to their respective mating surfaces with an electrically non-conductive adhesive. In certain embodiments, the heat sink may be electrically bonded to the leadframes, particularly if the leadframes are connected to the ground of the devices, and in certain embodiments, the heat sink may be held in thermal or electrical contact with the leadframes by other means and there may be either no adhesive material or there may be a non-adhesive compound such as thermal grease between the heat sink and leadframes.

Figure 7:
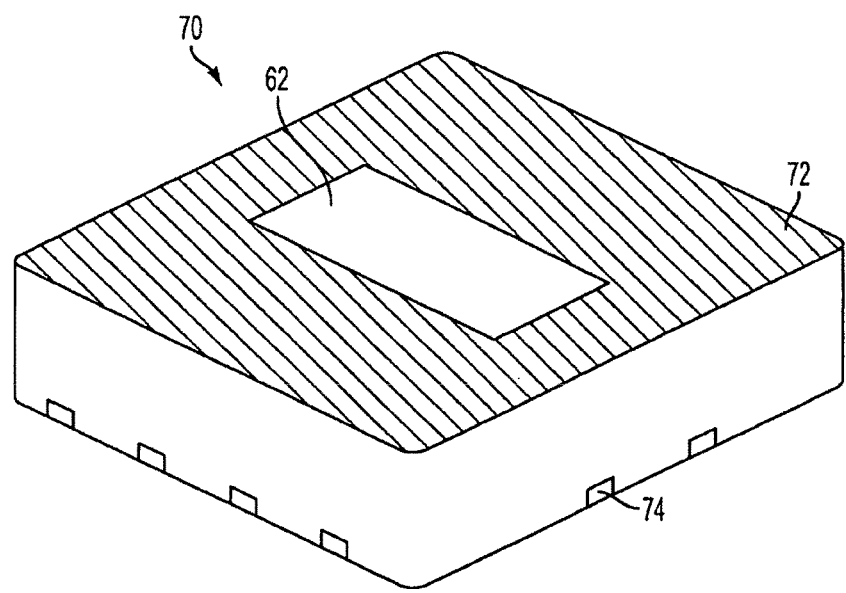
FIG. 7 is a perspective view of an integrated circuit assembly of FIG. 6 as a finished product after encapsulation according to certain aspects of the present disclosure.

FIG. 7 is a perspective view of an integrated circuit assembly 60 of FIG. 6 as a finished product 70 after encapsulation according to certain aspects of the present disclosure. In this embodiment, a molding compound 72 has been formed around the assembly 60, forming a solid body with contact pads 74 exposed. Certain embodiments may utilize a preformed shell in place of the molding compound. In this embodiment, the surfaces 62 of the heatsink 62 are left exposed and flush with the surface of the molding compound 72. If the finished product 70 is configured such that this surface 62 is in contact with an external heat sink or substrate (not shown), heat may be conducted from the heat sink 62 to the external heat sink.

Figure 8:
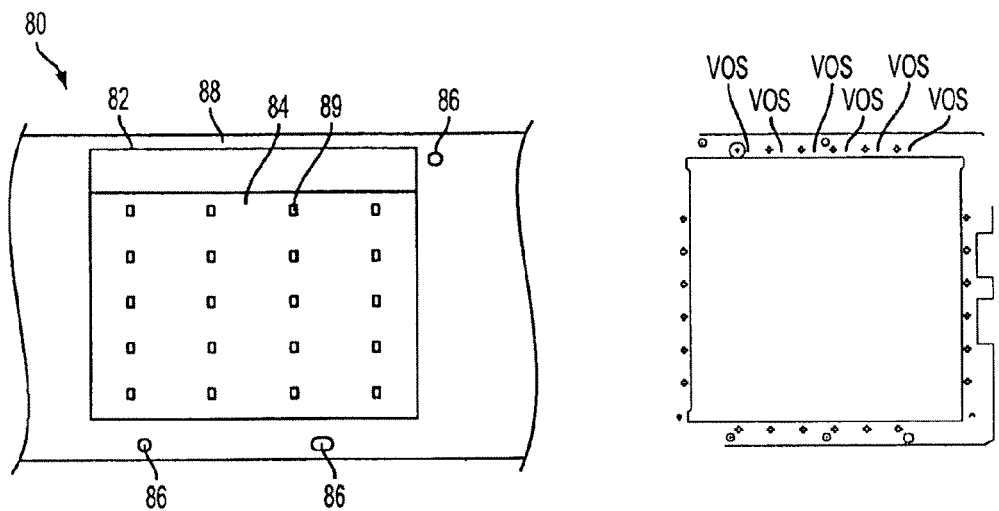
FIG. 8 shows a manufacturing frame configured to mount a carrier film and IC dice according to certain aspects of the present disclosure.

FIG. 8 shows a manufacturing frame 80 configured to mount a carrier film 84 and IC dice 89 according to certain aspects of the present disclosure. The frame material 88 is a thin sheet having an opening 82 sized to assemble a plurality of stacked leadframe assemblies. The frame material 88 has alignment features, shown as holes and slots 86 in this embodiment, for mounting and aligning this frame in a manufacturing stand or jig. In this embodiment, a sheet of plastic film 84 is attached to the back of frame material 88 across a portion of the height of the frame opening 82 as shown. As can be seen, a clear space is left at the top (in this view) of opening 82, the benefit of which will be discussed below. The film 84 has an adhesive coating (not shown) on the side facing the frame. This front face of film 84 is equivalent to the mounting surface of the finished stacked leadframe assembly. Dice 89 have been placed on the film 84 and are retained in position by the adhesive coating.

Figure 9:
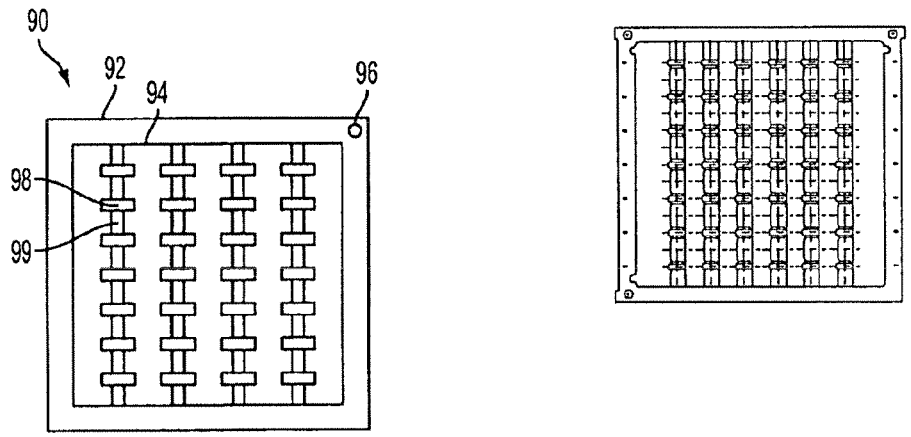
FIG. 9 shows a manufacturing frame in which has been formed a plurality of first leadframes according to certain aspects of the present disclosure.

FIG. 9 shows a manufacturing frame 90 in which has been formed a plurality of first leadframes 98 according to certain aspects of the present disclosure. The locations of the individual leadframes 98 correspond to the locations of the die 89 shown in FIG. 8. The leadframes 98 are connected to each other and the perimeter of opening 94 via support structures 99 that will be removed when the stacked leadframe assemblies are separated at the end of the assembly process. The external perimeter 92 of frame 90 is sized and shaped to fit, in this example, into the opening 82 of frame 80. When frame 90 is placed in opening 82, alignment features 96 will be located in the area not covered by film 84, improving the accuracy of alignment of frame 90 without requiring a secondary operation to remove film 84 in the area of alignment feature 96. The attachment surfaces of leadframes 98 will be in contact with the film 84.

Figure 10:
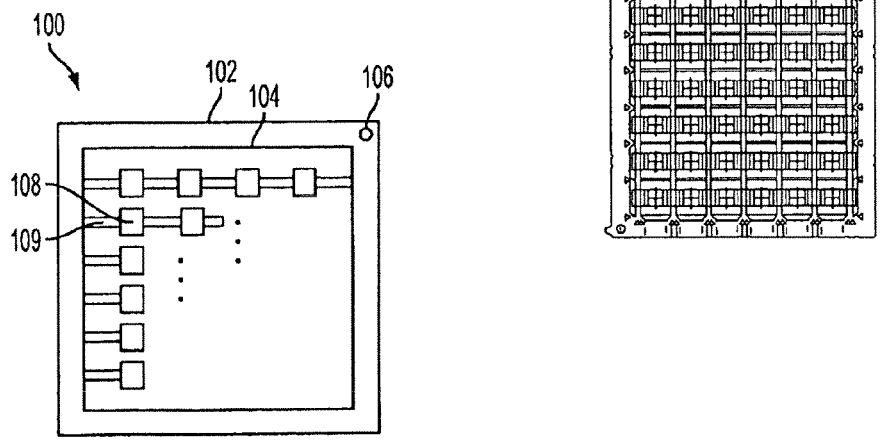
FIG. 10 shows a manufacturing frame in which has been formed a plurality of second leadframes according to certain aspects of the present disclosure.

FIG. 10 shows a manufacturing frame 100 in which has been formed a plurality of second leadframes 108 according to certain aspects of the present disclosure. The leadframes 108 are connected to each other and the edge of opening 104 via support structures 109 that will be removed when the stacked leadframe assemblies are separated at the end of the assembly process. These support structures 109 are formed such that they may overlay support structures 99 while still allowing the leadframes 108 to maintain their proper position in the stack. The outside perimeter 102 may be sized and shaped to fit within the opening 94 of frame 90 or may overlay frame 90. Alignment features 106 are positioned such that they will overlie the area of opening 82 in frame 80 that is not covered by film 84. In this example, the extended side panels of leadframes 108 extend in a direction substantially perpendicular to the side panels of leadframes 98. The attachment surfaces of leadframes 108 are in contact with film 84.

An example manufacturing process is described herein. It will be obvious to those of ordinary skill in the art that there are numerous variations in the details of each step and in the order of the steps that can be implemented without departing from the claims. An adhesive-coated film 84 is placed across the opening 82 of frame 80 as shown in FIG. 8. Frame 80 is attached to a reference jig in a "pick & place" machine which places dice 89 at specific locations on film 84, where the adhesive holds the die in place. A quantity of adhesive (not shown in the figures) is placed on the top of each dice. Frame 90 is then placed over frame 80 and aligned using features 96. The underside of leadframes 98 will be in contact with the top surfaces of dice 89. A quantity of adhesive is placed on the top surface of the die paddles of leadframes 98. A second set of dice (not shown in these figures) will be placed on each of leadframes 98, with a quantity of adhesive placed on the top of each of this second set of dice. Frame 100 is then placed over frame 90 and aligned using features 106. The underside of leadframes 108 will be in contact with the tops of the second set of dice.

This stacked set of frames 80, 90, and 100 is processed to cure the adhesive and the stacked leadframe assemblies are then separated. If the adhesive of the process described herein was solder paste, then the curing processing would be reflowing the solder in a controlled temperature oven. Alternately, the adhesive might include a catalyst and self-cure over a certain period of time. After separation, the individual leadframe assemblies may be placed on a tape reel (not shown) in a manner analogous to the handling of other IC devices, placed in trays, or otherwise packaged for handling and transfer to other assembly processes.

Figure 11:
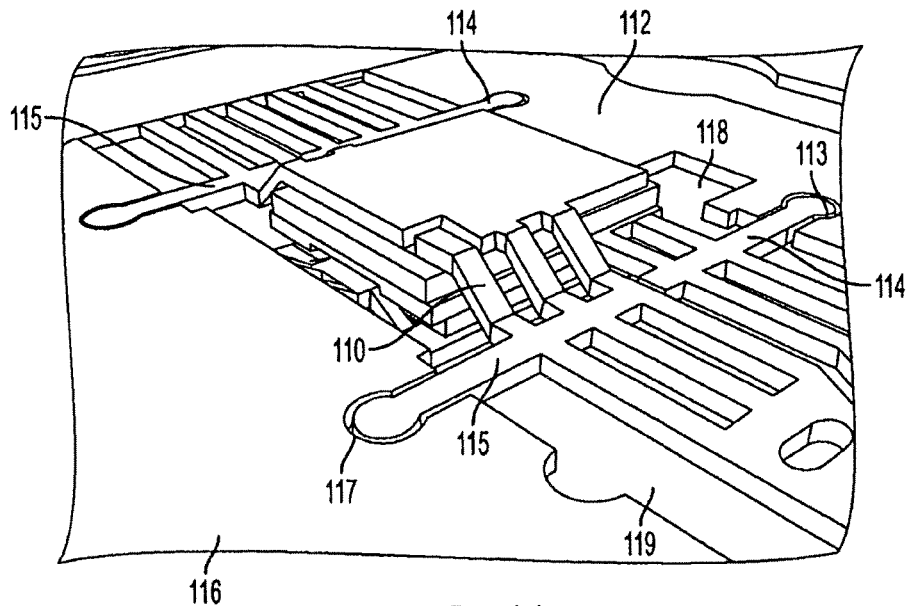
FIGS. 11 and 12 illustrate two example embodiments showing electrical connection of the dice to the leadframes according to certain aspects of the present disclosure.
Figure 12:
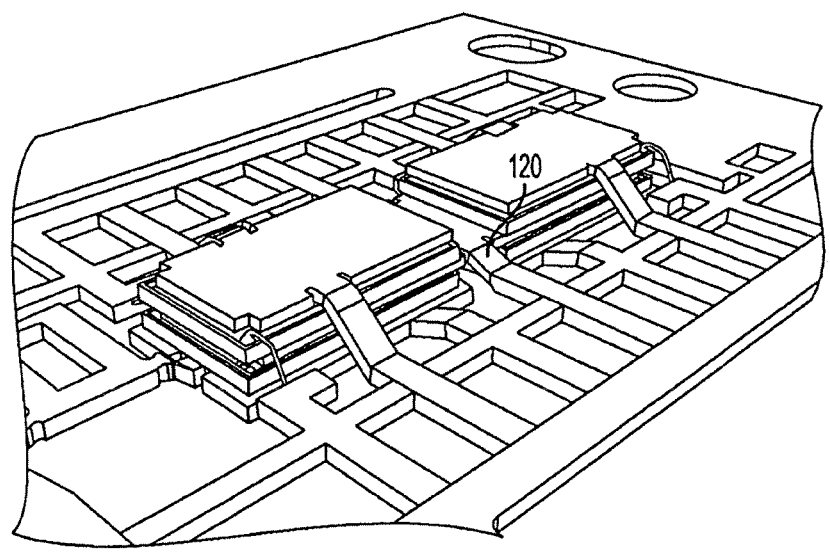

FIGS. 11 and 12 illustrate two example embodiments showing electrical connection of the dice to the leadframes according to certain aspects of the present disclosure. FIG. 11 shows a stacked leadframe assembly prior to separation from the manufacturing frames wherein the top leadframe has a separate element 110 in direct electrical contact with a portion of the top die. This may provide an electrical circuit connection in the final assembly.

FIG. 11 also illustrates how a dam bar is formed by the combination of the three manufacturing frames. The outer manufacturing frame comprises, in the view of FIG. 11, sections 112 and 116 having shaped notches 113 and 117, respectively. This pattern is repeated on the other side of this die location, visible in the view of FIG. 11, and at all other die locations (not shown) within the frame. The second frame had a partial bar dam 114 formed across the leads, wherein the partial dam bar 114 has a shaped tip at one end that fits into shaped notch 113 and a flat surface, in this example, at the other end of dam bar 114. The third frame has a partial dam bar 115 that also has a shaped tip at one end that engages with shaped notch 117 and a flat surface, in this example, at the other end that abuts the flat surface of partial dam bar 114. It will be apparent to those of skill in the art that other shapes of the tip and notch and of the abutting surfaces are possible. The abutting partial dam bars 114 and 117 on each side of the die location and the portions 112 and 116 of the first frame form a continuous perimeter around the die location. This continuous perimeter forms a dam for the overmolding of the stacked leadframe with molding compound. The overmolding step is accomplished by clamping this layered assembly of frames between shaped injection molding cavities (not shown) which seal against this perimeter of first frame section 112 and 116 and partial dam bars 114 and 115, forming a cavity around the stacked leadframe. The molding compound is injected through the area of notch 118, filling the open space within the perimeter of the dam bar. The dam bar prevents the molding compound from flowing into the area 119 without requiring the injection molding cavities to be shaped to conform to the openings in the frames. This minimizes encapsulation bleed during the overmolding process.

FIG. 12 shows a pair of stacked leadframe assemblies intended to be used as a pair, wherein the first leadframes of the stacked leadframe assemblies have a common circuit lead 120 which, in the final assembly, could provide a circuit function such as connection to an H-bridge motor controller.

Figure 13:
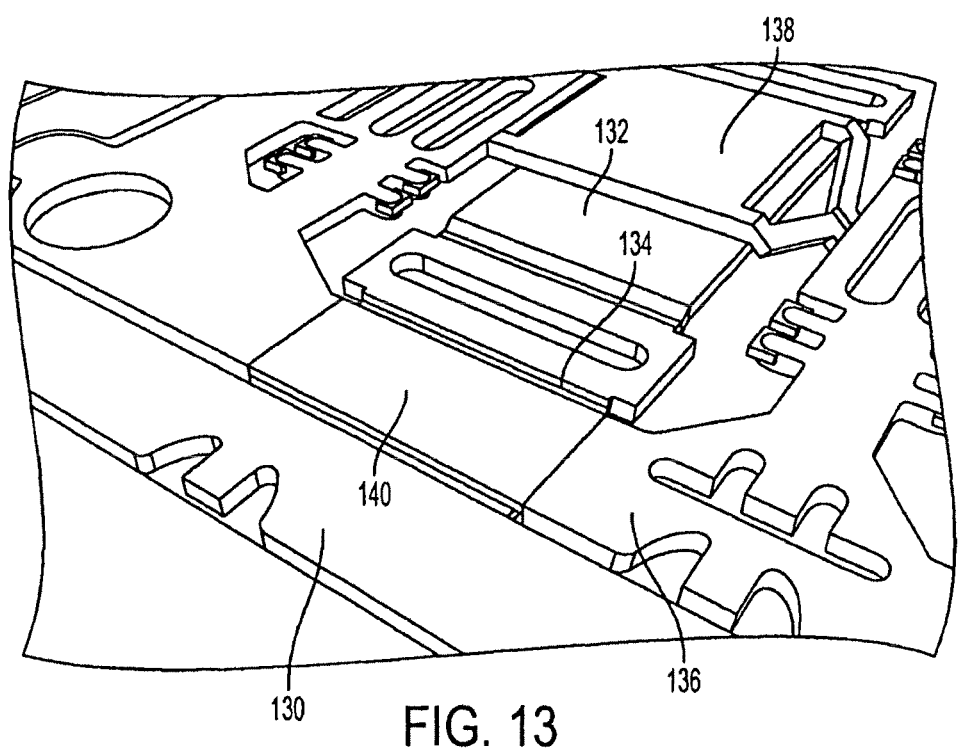
FIG. 13 illustrate how two manufacturing frames may be configured to stack with co-planar surfaces according to certain aspects of the present disclosure.

FIG. 13 illustrate how two manufacturing frames may be configured to stack with co-planar surfaces according to certain aspects of the present disclosure. In this example, an outer manufacturing frame 130 carries a plurality of first leadframes 132 which are connected to the outer manufacturing frame by bridge sections 134 that have been etched from the top, as seen in this view, to approximately half the original thickness. An inner manufacturing frame 136 carries a plurality of second leadframes 138 that are offset to fit over leadframes 132. The outer perimeter of inner manufacturing frame 136 has bridge sections 140 that cross over the bridge sections 134, where the bridge sections 140 have been etched from the bottom, in this view, to approximately half the original thickness. As both bridge sections 134 and 140 have been etched in opposite relative directions over coincident areas, forming matching notches across the coincident area, bridge section 140 overlays bridge section 134 and allows the inner manufacturing frame 136 to lie on a common plane with outer manufacturing frame 130. Positioning both the inner and outer manufacturing frames 136 and 130 to a common planar surface simplifies the manufacturing process.

It can be seen that the disclosed embodiments of the stacked leadframe assembly provide improved thermal and electrical connection of multiple stacked dice to a substrate. Enabling the use of stacked dice, especially for IC die such as high-power switching transistors that generate a large amount of heat, reduces the size of the total assembly while maintaining the junctions of the IC dice at temperatures that will provide a long, reliable operating life. These stacked leadframe assemblies can be assembled and then handled like other IC devices, reducing the impact of using these types of devices with existing equipment and processes.

The previous description is provided to enable any person skilled in the art to practice the various aspects described herein. While the foregoing has described what are considered to be the best mode and/or other examples, it is understood that various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. A phrase such an embodiment may refer to one or more embodiments and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method of manufacturing integrated circuit (IC) devices, the method comprising the steps of: providing a first lead frame that comprises one or more openings each comprising a plurality of shaped notches; placing with a pick-and-place machine a first die in at least one of the one or more openings; placing a second lead frame over the first lead frame, the second lead frame comprising one or more first partial dam bars each comprising a first shaped tip that fits into a first shaped notch of the first lead frame; and placing a third lead frame over the second lead frame, the third lead frame comprising one or more second partial dam bars each comprising a second shaped tip that fits into a second shaped notch of the first lead frame; wherein each of the one or more openings of the first lead frame and the respective first and second partial dam bars of the second and third lead frames cooperate to form a continuous dam completely encircling the die within the respective opening.

2. The method of claim 1, wherein: the first lead frame comprises a carrier film disposed across a portion of the at least one of the one or more openings; and the step of placing a die in the at least one of the one or more openings comprises placing each die on the carrier film disposed across the respective opening.

3. The method of claim 2, wherein: the first lead frame comprises an adhesive film disposed over a portion of the carrier film; and the step of placing a die in each of the one or more openings comprises placing each die on the adhesive film.

4. The method of claim 1, wherein each of the first, second, and third lead frames comprises one or more alignment features that allow the first, second, and third lead frames to be aligned relative to each other.

5. The method if claim 4, wherein the steps of providing the first lead frame and placing the second and third lead frames each comprise placing the respective one or more alignment features of the first, second, and third lead frames on a manufacturing jig.

6. The method of claim 1 wherein the first lead frame and the first and second partial dam bars comprise a common first thickness such that the continuous dam has a constant thickness.

7. The method of claim 6, wherein: the second and third lead frames are generally of the same first thickness as the first lead frame; the second lead frame comprises a first portion comprising a second thickness that is less than the first thickness; and the third lead frame comprises a second portion that overlaps the first portion of the second lead frame when the third lead frame is placed over the second lead frame, the second portion comprising a third thickness that is equal to the difference between the first and second thicknesses.

8. The method of claim 1, wherein: the first and second partial dam bars each comprise a first end and a second end; the first and second shaped tips are disposed at the respective first ends of the first and second partial dam bars; and the second ends of the first and second partial dam bars are disposed proximate to each other when the third lead frame is placed over the second lead frame.

9. The method of claim 1, further comprising the step of: placing with a pick-and-place machine a second die on the second lead frame over each of the one or more openings.

10. The method of claim 1, wherein the step of placing the third lead frame over the second lead frame, which was previously placed over the first lead frame, comprises forming a stack of lead frames, and the method further comprises the steps of: enclosing the stack of lead frames with a mold that comprising one or more shaped molding cavities that cooperate with the continuous dam of each of the one or more openings to form one or more volumetric spaces that respectively enclose a portion of the one or more openings; and injecting a molding compound into each of the one or more volumetric spaces.

11. The method of claim 1, wherein: the step of placing a second lead frame over the first lead frame comprises placing each first shaped tip into the respective first shaped notch; and the step of placing a third lead frame over the second lead frame comprises placing each second shaped tip into the respective second shaped notch.

12. A method of manufacturing an integrated circuit (IC) device, the method comprising the steps of: providing a first lead frame that comprises an opening, a first portion comprising a first thickness, and a second portion comprising a second thickness that is less than the first thickness; placing with a pick-and-place machine a die in the opening; placing a second lead frame over the first lead frame, the second lead frame comprising a third portion that overlaps the second portion of the first lead frame when the second lead frame is placed over the first lead frame, the third portion comprising a third thickness that is equal to the difference between the first and second thicknesses; wherein the first and second portions of the first lead frame and the third portion of the second lead frame cooperate to form a continuous dam around the die within the opening.

13. A set of lead frames comprising: a first lead frame comprising one or more openings each comprising a perimeter having at least one first shaped notch; a second lead frame comprising one or more first partial dam bars each comprising a first shaped tip that fits into one of the at least one first shaped notch of the first lead frame; wherein each perimeter of the one or more openings of the first lead frame and the first partial dam bar of the second lead frame cooperate to form a continuous dam completely encircling a portion of the respective opening when the second lead frame is placed over the first lead frame with each first shaped tip disposed within a respective first shaped notch.

14. The set of lead frames of claim 13, wherein: each perimeter of the one or more openings of the first lead frame further comprises at least one second shaped notch; the set of lead frames further comprises a third lead frame comprising one or more second partial dam bars each comprising a second shaped tip that fits into one of the at least one second shaped notch of the first lead frame; wherein each perimeter of the one or more openings of the first lead frame and the respective first and second partial dam bars of the second and third lead frames cooperate to form a continuous dam completely encircling a portion of the respective opening when the second lead frame is placed over the first lead frame with each first shaped tip disposed within a respective first shaped notch and the third lead frame is placed over the second lead frame with each second shaped tip disposed within a respective second shaped notch.

15. The set of lead frames of claim 14, wherein: the second and third lead frames are generally of the same first thickness as the first lead frame; the second lead frame comprises a first portion comprising a second thickness that is less than the first thickness; and the third lead frame comprises a second portion that overlaps the first portion of the second lead frame when the third lead frame is placed over the second lead frame, the second portion comprising a third thickness that is equal to the difference between the first and second thicknesses.

16. The set of lead frames of claim 14, wherein: the first and second partial dam bars each comprise a first end and a second end; the first and second shaped tips are disposed at the respective first ends of the first and second partial dam bars; and the second ends of the first and second partial dam bars are disposed proximate to each other when the third lead frame is placed over the second lead frame.

* * * * *